(12) United States Patent
Shi et al.

(10) Patent No.: US 6,338,779 B1
(45) Date of Patent: Jan. 15, 2002

(54) ARC MONITORING

(75) Inventors: Xu Shi; Xiao Zhe Jin, both of Singapore (SG); Hong Siang Tan, Selangor (MY)

(73) Assignee: Filplas Vacuum Technology PTE Ltd, Singapore (SG)

( * ) Notice: Subject to any disclaimer, the term of this patent is extended or adjusted under 35 U.S.C. 154(b) by 0 days.

(21) Appl. No.: 09/529,979
(22) PCT Filed: Oct. 26, 1998
(86) PCT No.: PCT/IB98/01765
§ 371 Date: Oct. 6, 2000
§ 102(e) Date: Oct. 6, 2000
(87) PCT Pub. No.: WO99/22397
PCT Pub. Date: May 6, 1999

(30) Foreign Application Priority Data

Oct. 24, 1997 (GB) ............................................. 9722648

(51) Int. Cl.⁷ ............................................. C23C 14/00
(52) U.S. Cl. ............................... 204/192.38; 204/298.41
(58) Field of Search ....................... 204/192.38, 192.13, 204/298.41, 298.03

(56) References Cited

U.S. PATENT DOCUMENTS 4,620,913 A * 11/1986 Bergman ................. 204/192 R
5,406,080 A 4/1995 Friedhelm ................... 250/309

FOREIGN PATENT DOCUMENTS

| EP | 0 393 957 | 10/1990 | ........... C23C/14/35 |
| EP | 0 495 447 A1 | 7/1992 | ........... C23C/14/32 |
| EP | 0 586 702 A | 3/1994 | ........... C23C/14/32 |
| EP | 0 658 634 A1 | 6/1995 | ........... C23C/14/35 |
| WO | WO 96/26532 | 8/1996 | ........... H01J/37/32 |

OTHER PUBLICATIONS

European Patent Office, Patent Abstracts of Japan Publication No. JP3131049; Publication Date Jun. 4, 1991.
International Search Report of International Application No. PCT/IB98/01765 mailed Feb. 11, 2000.
Patent Abstracts of Japan Publication No. JP05070949A; Publication Date Mar. 23, 1993.

* cited by examiner

*Primary Examiner*—Nam Nguyen
*Assistant Examiner*—Steven H. Ver Steeg
(74) *Attorney, Agent, or Firm*—Sterne, Kessler, Goldstein & Fox p.l.l.c.

(57) ABSTRACT

A cathode arc source apparatus for depositing a coating on a substrate is provided with a monitor for monitoring the cathode arc source. The monitor is useful for monitoring position of an arc spot on the target, plasma emission by the source, or current through or potential difference at a secondary anode. A controller can take actions such as shutting down the source, varying the power or restriking the arc in response to output from the monitor.

13 Claims, 6 Drawing Sheets

Fig. 4

ARC MONITORING

The present invention relates to monitoring of a cathode arc source, and in particular to monitoring of the cathode arc spot, the plasma emitted by the arc, the rate of deposition of a coating on a substrate and the thickness of the coating deposited.

Cathode arc deposition of tetrahedral amorphous carbon, metallic, dielectric and other such coatings is known in the art and offers the potential for deposition of thin films of high quality. Applications in scratch resistant optical coatings and hard disc media coatings are but two of a wide range of proposed uses.

Hitherto, deposition of films by the cathode arc process has been limited to laboratory use, in general because of difficulties in the art in reliably depositing films that are free of or have acceptably low contamination by macroparticles large, neutral particles.

Provision of improved means for filtering macroparticles from the arc plasma have recently been described in WO-A-96/26531 and also in as yet unpublished International patent application no. PCT/GB97/01992. Nevertheless, existing cathode arc sources have some drawbacks which it would be desirable to overcome or reduce to provide for ease of long term and industrial use of this technology.

It is, for a first example, observed that in use of a cathode arc source, the arc spot typically moves erratically over the surface of the target. Wear of the target can as a result be uneven—which can lead to wastage of the target, undesirable if made of expensive material. More problematic, the spot may move off the side of the target—if arcing occurs between the metal base of the cathode, rather than the target, and the anode the deposited film is likely to be severely contaminated and the arc source may be damaged. Further, deposition rate typically drops off as the spot approaches the outer edges of the target, making the deposition process less efficient. The art teaches the solution of visual inspection of the arc by the operator.

JP 05070949 teaches a cathode arc source deposition apparatus. The described apparatus has a secondary electrode having a more negative potential than the cathode so that the positive target ions are drawn towards the secondary electrode. The secondary electrode therefore permits detection of the ion current flowing from the cathode target, and thus detection of a change in the evaporation rate of the target material. Furthermore, whilst this document teaches a method for detecting a change in the evaporation rate of a target material, there is no teaching of how to monitor deposition rate of a coating or coating thickness.

EP-A-0586702 also teaches a cathode arc source deposition apparatus. This document teaches monitoring of a cathode arc spot on a cathode target, and in particular how to control the position of the arc spot on a cathode having an extended (ie. elongate) form. According to EP-A-0586702, this may be achieved by employing an extended conductor made of a material with high resistivity (eg. Nichrome alloy), and having two power supply leads on opposite ends. The power supply leads are connected to current stabilisers (ie. resistors) which are connected to each other and to the positive terminal of a direct current power supply, the negative terminal of the power supply being connected to the cathode.

Turning to the deposited film, its thickness in many instances is crucial to its particular application, and it can also be required that film thickness be even across the whole deposited film. However, at present the only available means to control thickness is to control the time of deposition. As it is found that film thickness is not directly related to deposition time, a consequence is that only crude control of film thickness has hitherto been possible.

JP 3131049 relates to chemical vapour deposition (CVD) and not to filtered cathode arc deposition. The method disclosed teaches monitoring of the total quantity of light emission which may then be correlated with a given film thickness. This document does not address filtered cathode arc source deposition and, in particular, the problems of achieving a uniform coating and/or deposition rate associated with the scanned cathode arc source plasma beam.

It is further desirable to be able to monitor when the arc needs restriking, though at present the only way of doing so is (1) by observation by an operator, or (2) by using a pulsed arc power supply to perform restriking at high frequency.

In the latter case, the arc trigger must be physically fixed and the arc is struck repeatedly at the same point on the target. Material of the trigger then typically contaminates the arc. A large pit in the target appears where the arc is struck; thus target use is uneven.

The present invention seeks to provide for arc monitoring to overcome or at least ameliorate some of the identified problems. It is therefore an object of the invention to provide method and apparatus for monitoring the arc in a cathode arc source and method and apparatus for monitoring and controlling thickness of films deposited with a cathode arc source.

Accordingly, the invention provides a cathode arc source apparatus for depositing a coating on a substrate, said source comprising an anode and a cathode station for a target, arc current flowing in use between the anode and the target so that plasma containing positive target ions is emitted and deposited on the substrate, a secondary anode which is grounded in use, and means for monitoring potential difference at the secondary anode. The monitoring functions available preferably are selected from monitoring position of an arc spot on the target; and/or monitoring plasma emitted from the target.

The apparatus of the invention is thus of particular advantage in that it enables an operator to have considerably improved control of the cathode arc source.

Movement of the arc spot over the target is generally both erratic and rapid. The apparatus of the invention may monitor movement of the spot into particular areas of the target from which it is desired to exclude the spot, such as the target periphery as film quality deteriorates when the spot is in this position—or the edge of the target, rather than monitoring precise spot position at all times.

In an embodiment of the invention described in an example below, the source comprises a secondary anode located proximal to the target and means for monitoring potential difference at the secondary anode. In a specific example of the invention, the secondary anode is insulated from the cathode, and is water cooled. It can be made of any suitable material and copper has been used in an example. Cooling of the secondary anode is optionally via a separate supply of cooling water or in series with cooling of the target.

In use, as the arc spot approaches close to the edge of the target, the potential difference at the secondary anode is monitored, the secondary anode being grounded via a large resistance. In normal operation, the potential difference at the secondary anode is typically a large, positive voltage. If this voltage drops to below a predetermined level, such as about 5 volts or about 0 volts, this indicates the arc spot has approached close to the edge of the target. At this point it is desirable either to stop the arc or retrigger the arc or take steps to prevent deposition of plasma generated at that time, as the plasma and hence the deposited film may be contaminated.

It is convenient for the apparatus to comprise a feed back circuit which will trigger or initiate a reaction in response to readings taking at the secondary anode. For example, the feed back circuit can comprise a controller which in response to a fall in potential difference at the secondary anode below a certain level will initiate a reaction selected from shutting down the power supply to the arc, reducing the power supply to the arc, restriking the arc, shutting down or reducing the power supply to the arc and then restriking the arc, obstructing deposition of plasma on the substrate or providing a visual or audible alert to an operator.

A specific secondary anode of the invention is composed of a non-insulating, ceramic ring mounted around an upper edge of the target and projecting from a conducting, metal clamp attached to secondary anode circuitry that includes a volt meter. The ceramic ring is in that instance made of $Al_2O_3$ and prevents the arc reaching the conducting portions of the secondary anode.

The invention also provides a method of deposition of a coating on a substrate using a cathode arc source, said source comprising an anode and a cathode station for a target, arc current flowing in use between the anode and the target so that a plasma containing positive target ions is emitted and deposited on the substrate, a secondary anode which is grounded in use, and means for monitoring potential difference at the secondary anode;

comprising monitoring (a) position of the arc spot, or (b) plasma emitted from the target, by measuring the potential difference at the secondary anode.

In a further embodiment of the invention there is provided cathode arc source apparatus, further comprising means for monitoring deposition of the coating on the substrate, optionally for monitoring rate of deposition of the coating and/or thickness of the coating. A suitable monitoring apparatus is a photo-detector for detecting light emitted by the plasma coupled to a computer for calculating therefrom the rate of deposition or the thickness of the coating or both of these parameters.

The invention also provides a method of deposition of a coating on a substrate using a cathode arc source, said source comprising an anode and a cathode station for a target, arc current flowing is use between the anode and the target so that a plasma containing positive target ions is emitted and deposited on the substrate;

comprising monitoring (a) rate of deposition of the coating and/or (b) thickness of the deposited coating, by detecting light emitted from a specific area of the plasma and calculating therefrom the rate of deposition and/or the thickness of the coating.

Hitherto, monitoring rate of deposition and thickness of coating was particularly problematic, as the parameters involved are found not to be proportional to deposition time. The invention thus offers significant improvements in monitoring of film thickness and consistency.

A specific light detector described in a example below is a photo diode. This is optionally located in or close to a chamber in which deposition occurs. It is suitable that the photo diode be located in such a position that it receive light emitted from plasma shortly before the plasma impinges upon the substrate, such as downstream of plasma beam scanning, as by doing so measurements of rate of deposition and coating thickness are more likely to be an accurate reflection of the deposition process that is taking place.

In a specific embodiment of the invention, a photo diode further comprises a mesh screen or shield which is positively biased and located so as to repel positive ions and reduce or avoid build up of a coating on detector surfaces of the diode.

To calculate rate of deposition and/or deposition thickness from the readings from the diode it is appropriate to carry out an integration of the signal to give a value for deposition rate. By measuring the deposition rate against time a film thickness can thereby be calculated.

It is a further option for the output from the light detector to be operatively linked to the controller of the arc power supply. If plasma deposition falls below a minimum value then it might be appropriate to shut down the power supply and restrike the arc. Thus, it is an option for the monitoring device of the apparatus of the invention to provide, in response to a drop in deposition rate below a predetermined value, for a reaction selected from shutting down the power supply to the arc, reducing the power supply to the arc, restriking the arc, shutting down or reducing the power supply to the arc and then restriking the arc, obstructing depositions of plasma on the substrate or providing a visual or audible alert to an operator.

In a further embodiment of the invention the light detector comprises a photo diode in combination with a lens for focusing on an area of the plasma beam to be monitored. For applications in which consistency of thickness is of extreme importance it is further an option for the apparatus to comprise a plurality of light detectors arranged for focusing on different parts of the plasma beam. Alternatively, the monitoring means can comprise a single or a reduced number of light detectors and means for focusing on different areas of the plasma beam. Thus, readings for different parts of the plasma beam can be taken by the same light detector.

Generally, the density of the plasma beam is homogenous and thus a further embodiment of the invention comprises detecting light emitted by the plasma beam at a single position upstream of beam scanning.

The light detector is suitable for use with different plasmas as in all cases the deposition rate is proportional to the plasma density. Prior to obtaining accurate measurements the light detector must be calibrated and this can be done by routine techniques. The light detector chosen will conveniently be suitable for detecting light over a wide range of wavelengths, corresponding to the difference plasma colours produced by different coatings. For example, a coating comprising carbon and nitrogen ions is pink coloured as are most coatings including nitrogen ions. Plasma from a graphite target is bluely-white whilst plasma containing titanium and oxygen ions or aluminum and oxygen ions is predominantly white in colour.

When laying down a coating such as a scratch resistant coating of tetrahedral amorphous carbon on hard disk media, thickness variations are not particularly critical to performance, though the thickness required is typically only about 50–70 angstroms. The monitoring apparatus can thus be advantageously used to ensure that as soon as the appropriate thickness coating has been attained then no extra and redundant further thickness of coating is applied. For optical coatings which may typically have a thickness of 400–500 angstroms the thickness variation is often critical to performance of the coating, as a particular thickness with a narrow tolerance is required to obtain, for example, the desired reflection characteristics of the optical coating. The monitoring apparatus of the invention is of advantage in ensuring that the desired thickness is accurately and consistently obtained.

The invention is now illustrated with reference to drawings in which:

FIG. 4 is a graph showing deposition time in seconds against intensity of light emitted from carbon plasma (arbitrary units);

Figure 1:
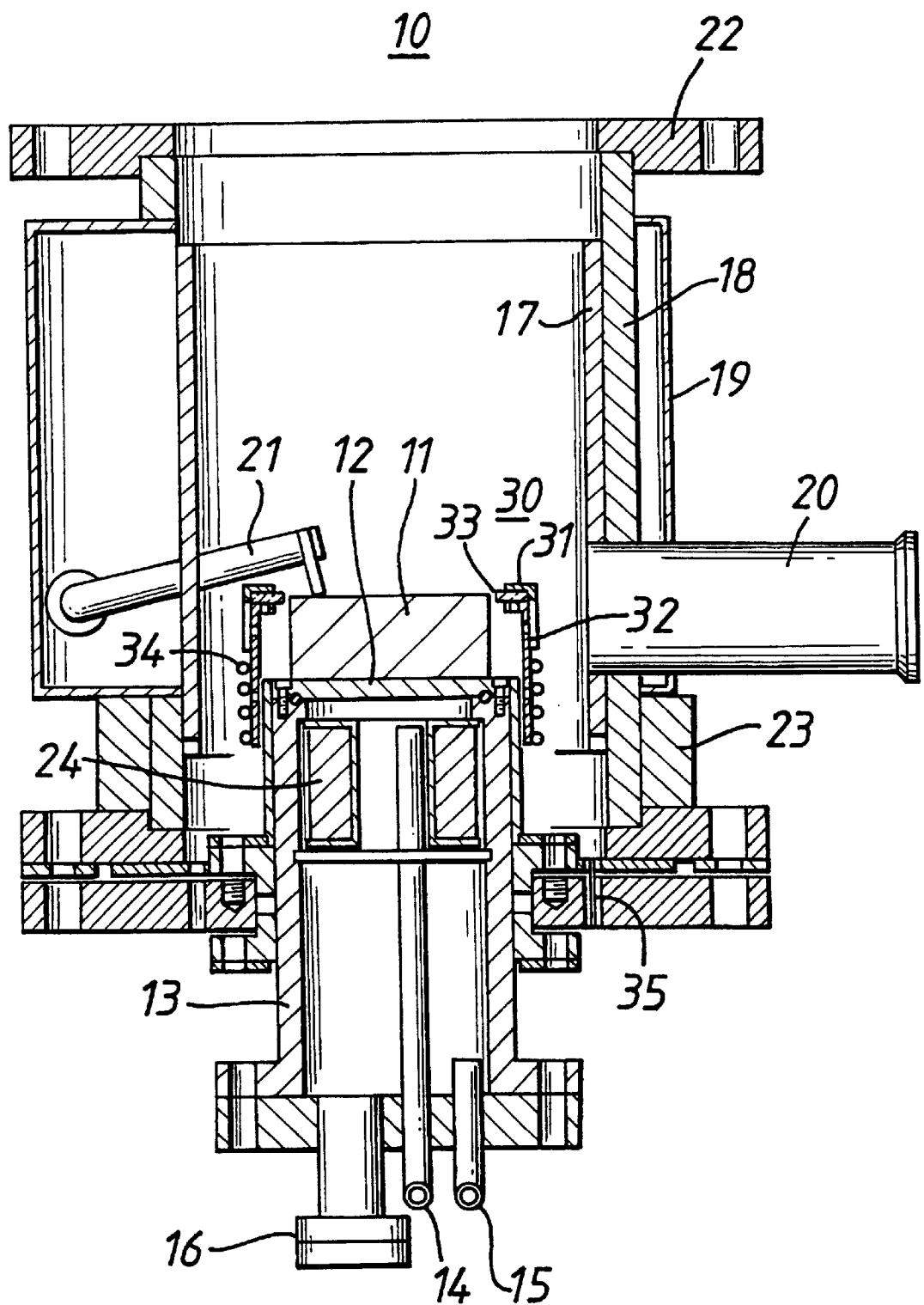
FIG. 1 shows a schematic cross-section of a cathode arc source comprising a secondary anode according to the invention.
Figure 7:
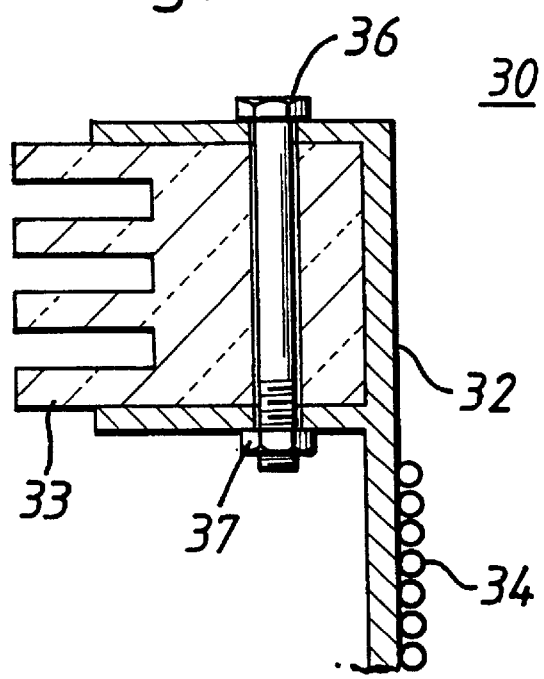
FIG. 7 is a schematic cross-section of a portion of a secondary anode of the invention.

Referring to FIGS. 1 and 7, a cathode arc source shown generally as 10 comprises a target 11 located on a cathode station 12 and a cathode body 13. Cooling of the target is achieved by flow of cooling water through inlet 14 and outlet 15. A feed through 16 allows access of electrical wires for electromagnet 24 located below the target 11, electromagnet 24 in combination with electromagnet 23 providing a magnetic field around the target to improve arc performance.

Anode liner 17 is fitted tightly against anode wall 18, cooled by flow of water through cooling water housing 19. Visual observation of the arc is via view port 20 and striking of the arc is achieved via rotary striker 21.

The cathode arc source 10 is in use attached via flange 22 to filtering apparatus and thereafter to a deposition chamber, neither of which are shown.

A secondary anode shown generally as 30 is composed of a shield cap 31, not shown in FIG. 7, and a ceramic ring 33 clamped into secondary anode body 32 via bolt 36 and nut 37. Cooling of the secondary anode 30 is via flow of water through cooling pipes 34. A feed through 35 allows access into the vacuum chamber of secondary anode circuitry (not shown).

During operation of the cathode arc source, the arc spot moves rapidly and erratically over the surface of the target and may approach very close to the edge of the target; the result being a drop in deposition rate and the risk of arcing between the cathode body and the anode.

Whilst the arc spot is towards the centre of the target, the potential difference at the secondary anode is large and positive, typically 10+ or 20+ volts. This potential difference drops sharply as the arc spot approaches to the very edge of the target and thus a drop in potential difference is used to trigger a safety response, such as shutting down the arc power supply for restriking the arc closer to the centre of the target.

Figure 2:
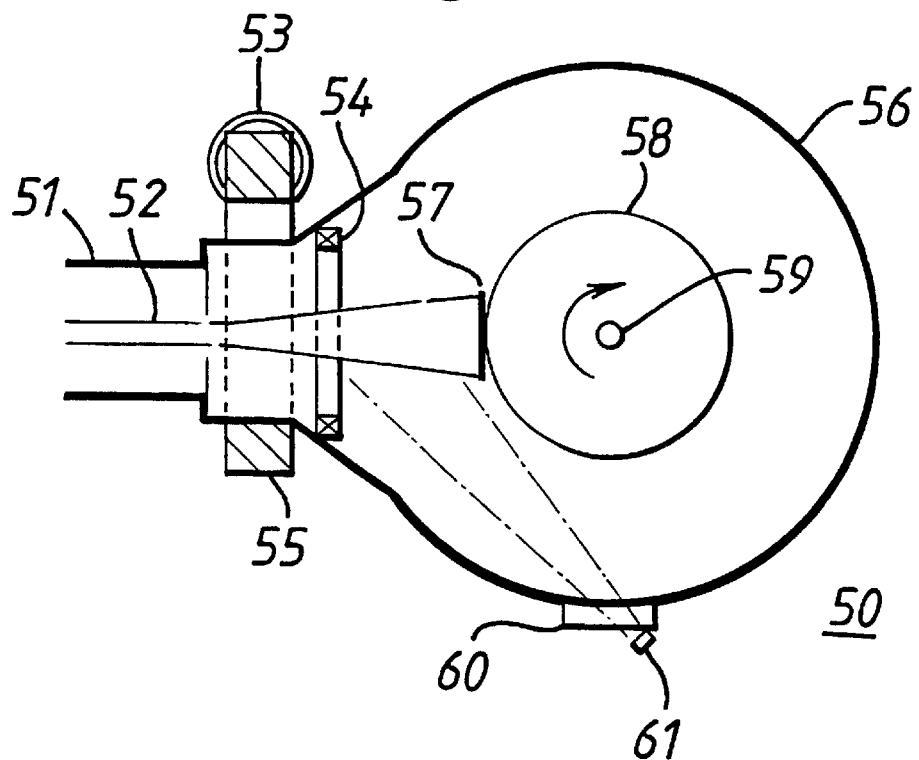
FIG. 2 shows a schematic cross-section of a deposition chamber comprising a light detector according to the invention.

Referring to FIG. 2, a deposition apparatus shown generally as 50 is connected to the output of duct 51 from a cathode arc source, not shown, and plasma 52 from the cathode arc source is deposited upon substrate 57 located on substrate holder 58 which turns about pivot 59. Plasma 52 is scanned into a coating beam via scan coil 53 around magnetic core 55 and focusing coil 54. The chamber 56 of the deposition apparatus includes view port 60 for visual observation of the deposition process and also includes photo diode 61 located so as to receive light emitted from plasma 52. In the arrangement shown the photo diode is focused upon light downstream of plasma scanning, though it is optional for the photo diode to be focused on light upstream of beam scanning. In addition, whilst beam scanning in shown in FIG. 2, some coating application do not require any beam scanning.

Alternatively, the photo diode can be located closer to the exit of duct 51; for example it could be located next to focusing coil 54.

Output from the photo diode is used to calculate rate of deposition of coating on the substrate and thickness of coating on the substrate, calculations being carried out by a micro circuit or by software that also controls the arc power supply.

Though not shown in FIG. 2, the photo diode can be protected from accumulation thereon of coating material by location of a positively biased mesh between the plasma and the photo diode, typically biased at about 50–100 volts. Data from the diode can be acquired using a high speed data acquisition system such as using a micro processor, the data being digitized and then integrated and sent to a processing circuit as a thickness signal. A central arc controller can be used to control arc triggering and other arc functions using inputs from the secondary anode or the photo diode or both, and also receiving input from the operator.

Figure 3:
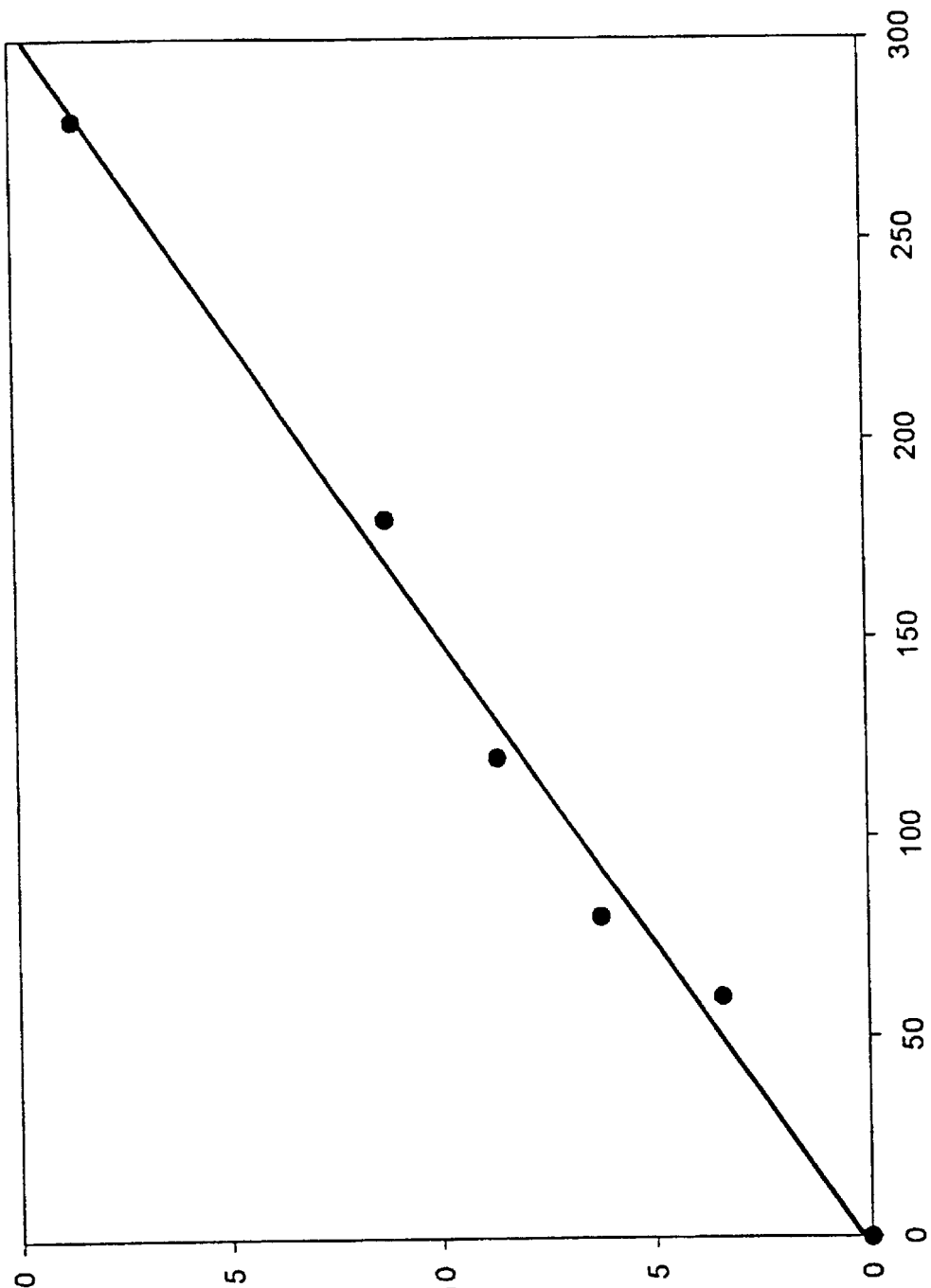
FIG. 3 is a graph showing light intensity against output current from a light detector of the invention.

Photo diode 61 has an integral colour correction filter and its light wavelength range is from 350 nm to 800 nm. Typically, light emitted by the plasma is weak and therefore the photo diode chosen is a large area (100 $mm^2$) photo diode. The photo diode sensitivity is about 70 nA/lux, and we have measured the output current and compared this with the light intensity and the results are illustrated in the graph in FIG. 3. It is seen that light intensity and photo diode output are in proportion.

Because of the proportional relationship between light intensity and output current, a current-to-voltage convertor is designed to convert the weak current obtained to a voltage value. This signal is then sent to a voltage amplifier and output to analogue-to-digital (a/d) converter in a controller system. The a/d converter samples the signal 250 times per second and the controller accumulates the value of the sampled signal.

Figure 4:
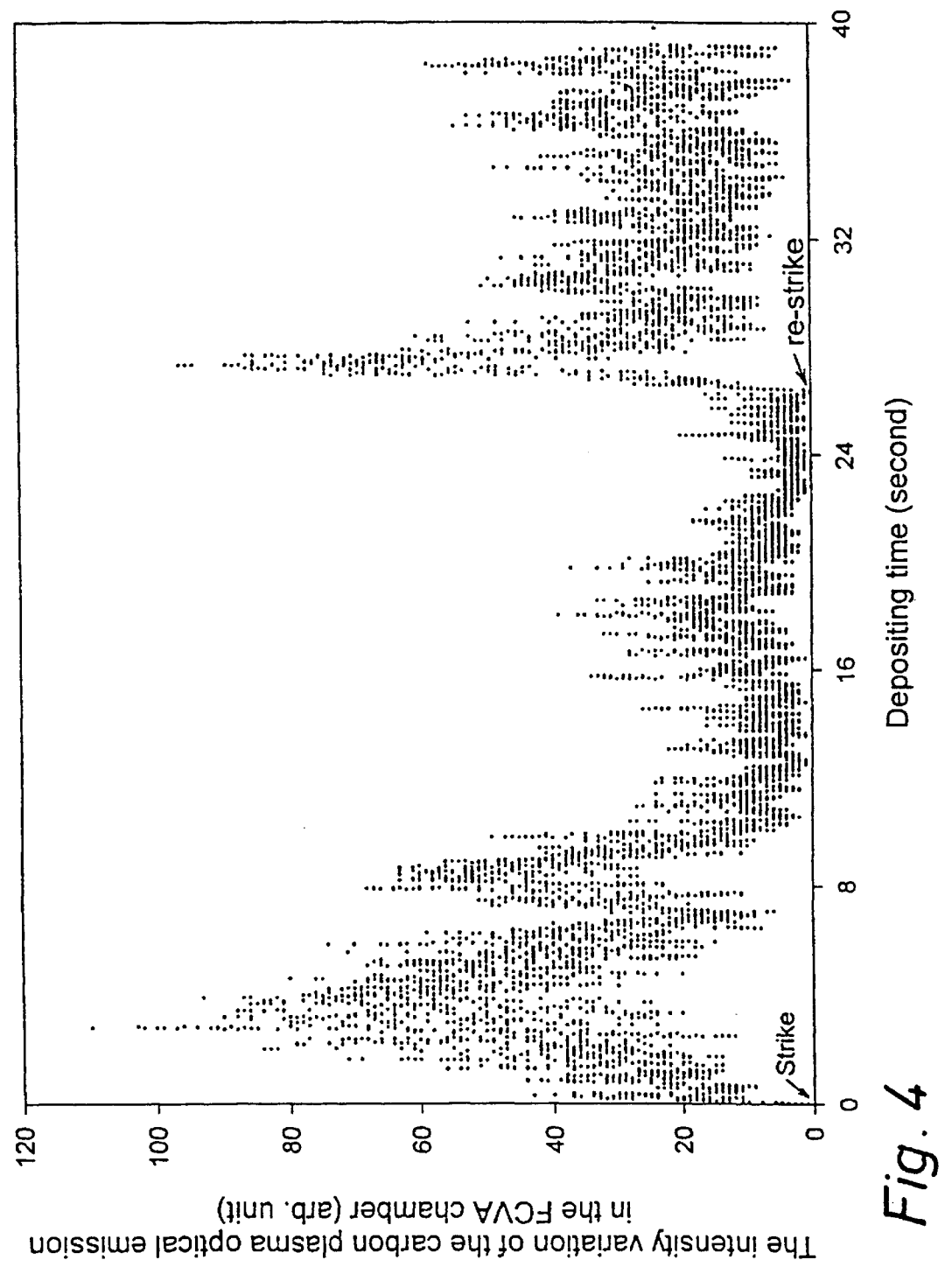

We have measured how the output signal varies against time and a sample of the variation observed is shown in the graph in FIG. 4. It is clear that the plasma intensity varies greatly.

The substrates used for testing deposition of tetrahedral amorphous carbon were polished silicon wafers placed at the centre of the deposition area and in fact the measurements described above were taken without scanning of the plasma beam, and the thickness of the deposited tetrahedral amorphous carbon film was measured using Leica MBV SP universal film thickness measurement system.

Figure 5:
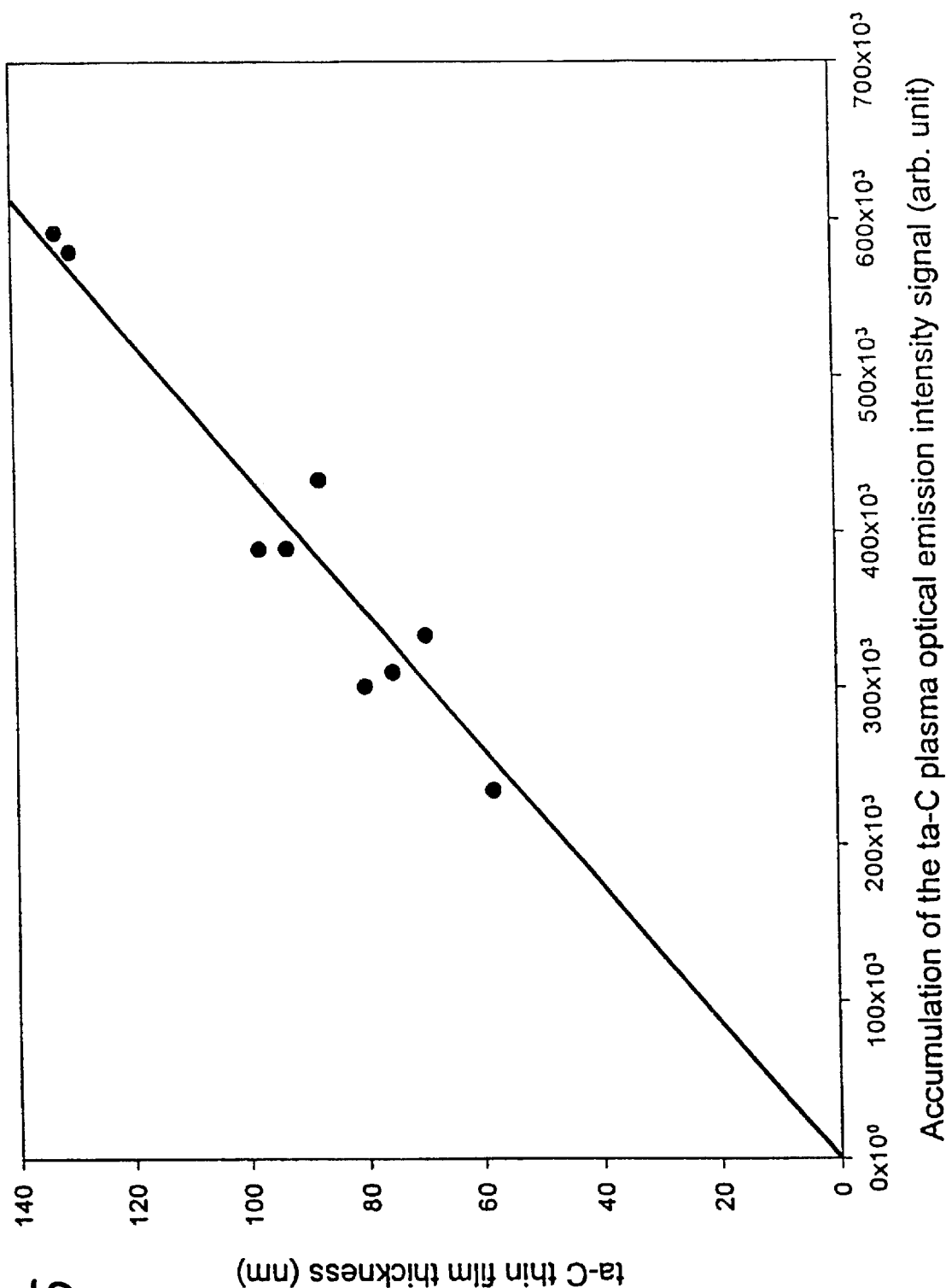
FIG. 5 is a graph showing accumulated optical omissions from carbon plasma against thickness of deposited tetrahedral amorphous carbon film.

We have also measured the thickness of deposited tetrahedral amorphous carbon films as a function of accumulated plasma optical emission intensity, and the results are shown in the graph in FIG. 5. The deposition time of these samples varied from 15 seconds to 30 seconds and the results show that film thickness is proportional to the accumulated plasma optical emission intensity. They also mean that the intensity of the optical emission is proportional to the average density of the plasma of this arc current. Thus, the thickness (t) of the film is given by:

$$t=Cp$$

where p is the accumulated plasma optical omission intensity. C in this experiment is approximately $2.285 \times 10^{-4}$ nm per unit.

To verify the results obtained, an experiment was carried out to try to obtain thin films of thickness 100 nm. We obtained an average thickness of 104.5 nm with an error of less than 8% of obtaining the desired thickness. The full are:

| Experiment | Duration(s) | Thickness (nm) | Error (%) |
|---|---|---|---|
| 1 | 23 | 100.1 | −4.18 |
| 2 | 18 | 97.1 | −7.05 |
| 3 | 29 | 104.3 | −0.16 |
| 4 | 25 | 108.9 | 4.24 |
| 5 | 19 | 104.2 | −0.26 |
| 6 | 30 | 112.2 | 7.40 |
| Average | | 104.5 | |

Figure 6:
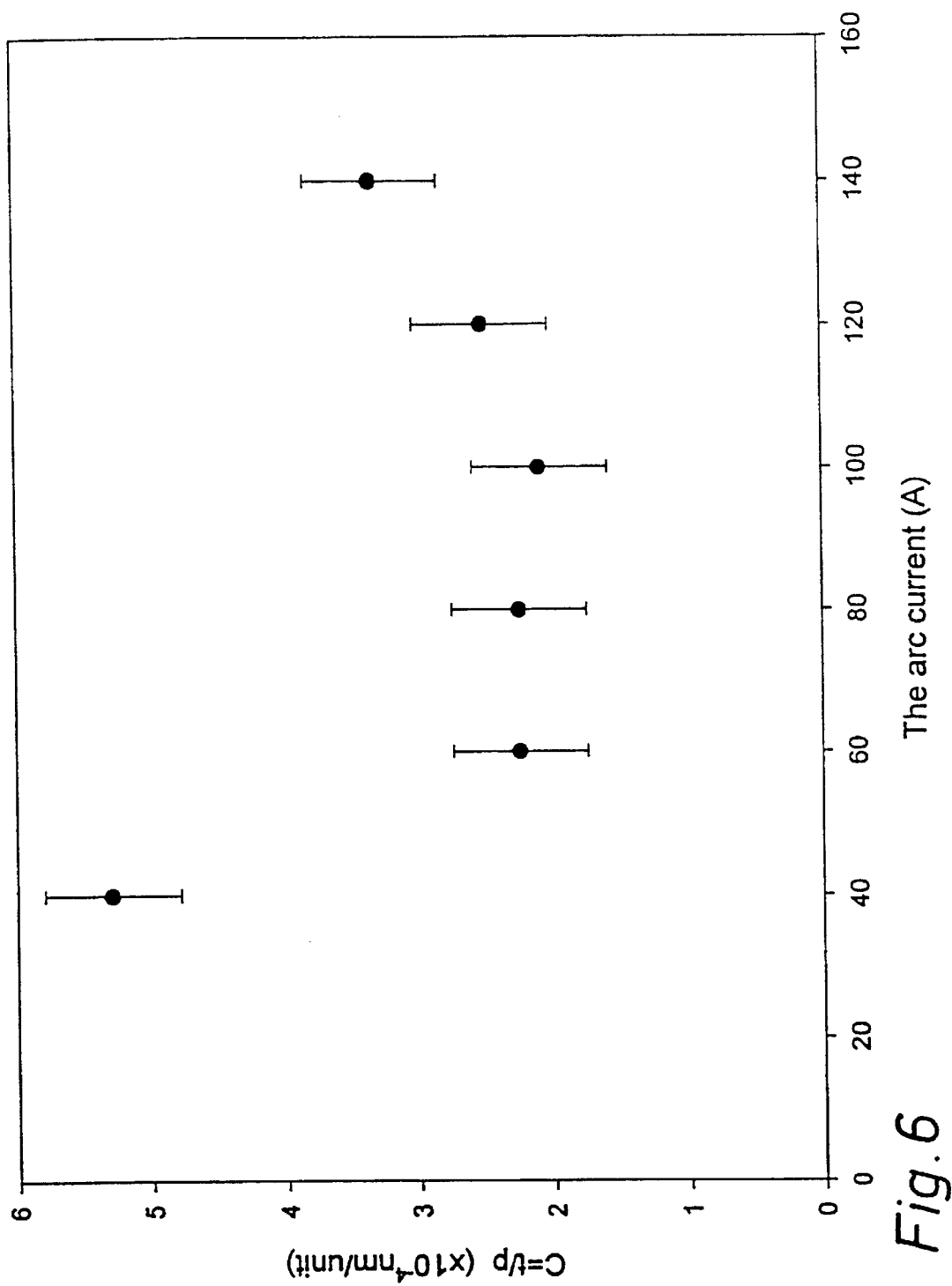
FIG. 6 is a graph showing arc current against deposition rate.

We also investigated the relationship between film thickness and accumulated optical emission as a function of the arc current, and the results are shown in FIG. 6. The intensity of the plasma optical emission depends on the ion density and the ion energy in the filtered cathode vacuum arc.

The invention thus enables monitoring and control of a cathode arc source, including monitoring of the arc spot and the taking of actions to prevent contamination on of the coating and/or damage to the apparatus, and including monotoring deposition rate and thickness of coating.

What is claimed is:

1. A cathode arc source apparatus for depositing a coating on a substrate, said cathode arc source apparatus comprising:
    an anode and a cathode station for a target, arc current flowing in use between the anode and the target so that plasma containing positive target ions is emitted and deposited on the substrate,
    a secondary anode which is grounded in use, and
    means for monitoring a potential difference at the secondary anode.

2. The apparatus of claim 1 wherein the secondary anode is located proximal to the target.

3. The apparatus of claim 1, further comprising a controller adapted to trigger a reaction in response to readings taken at said secondary anode.

4. The apparatus of claim 3 wherein the controller triggers a response to a fall in the potential difference at the secondary anode below a predetermined level and initiates a reaction selected from the following:
    (i) shutting down a power supply to the arc;
    (ii) reducing the power supply to the arc;
    (iii) re-striking the arc;
    (iv) shutting down or reducing the power supply to the arc and then re-striking the arc;
    (v) obstructing deposition of plasma on the substrate; or
    (vi) providing a visual or audible alert to an operator.

5. The apparatus of claim 4 wherein the controller triggers a reaction when the potential difference at the secondary anode falls below about 5V.

6. The apparatus of claim 4, wherein the secondary anode is grounded via a large resistance.

7. The apparatus of claim 1, wherein the secondary anode is grounded via a large resistance.

8. A method of deposition of a coating on a substrate using a cathode arc source, said source comprising an anode and a cathode station for a target, arc current flowing in use between the anode and the target so that a plasma containing positive target ions is emitted and deposited on the substrate, a secondary anode which is grounded in use, and means for monitoring a potential difference at the secondary anode; wherein the method comprises at least one of the following steps:
    monitoring a position of an arc spot, or
    monitoring plasma emitted from the target, by measuring the potential difference at the secondary anode.

9. The method of claim 8 wherein the secondary anode is located proximal to the target.

10. The method of claim 8 further comprising in response to a fall in potential difference at the secondary anode below a predetermined level, initiating a reaction selected from the following:
    (i) shutting down a power supply to the arc;
    (ii) reducing the power supply to the arc;
    (iii) re-striking the arc;
    (iv) shutting down or reducing the power supply to the arc and then re-striking the arc;
    (v) obstructing deposition of plasma on the substrate; or
    (vi) providing a visual or audible alert to an operator.

11. The method of claim 10, wherein the predetermined level is 5V.

12. A method of deposition of a coating on a substrate using a cathode arc source, said source comprising an anode and a cathode station for a target, arc current flowing in use between the anode and the target so that a plasma containing positive target ions is emitted and deposited on the substrate, a secondary anode which is grounded in use, and means for monitoring potential difference at the secondary anode; wherein the method comprises
    detecting light emitted from a specific area of the plasma; and
    calculating therefrom (i) a rate of deposition of the coating, (ii) a thickness of the coating or (iii) both a rate of deposition and a thickness of the coating.

13. The method of claim 12 wherein the light is detected using a photo diode.

* * * * *